(12) United States Patent
Hsiao et al.

(10) Patent No.: US 7,417,593 B1
(45) Date of Patent: Aug. 26, 2008

(54) WIRELESS APPARATUS FOR INCREASING ANTENNA GAIN

(75) Inventors: Lan-Yung Hsiao, Taipei Hsien (TW); Kai Shih, Taipei Hsien (TW); Yu-Yuan Wu, Taipei Hsien (TW)

(73) Assignee: Cheng Uei Precision Industry Co., Ltd., Taipei Hsien (TW)

( * ) Notice: Subject to any disclaimer, the term of this patent is extended or adjusted under 35 U.S.C. 154(b) by 0 days.

(21) Appl. No.: 11/696,604

(22) Filed: Apr. 4, 2007

(51) Int. Cl.
*H01Q 1/24* (2006.01)
*H01Q 13/10* (2006.01)
*H01Q 1/48* (2006.01)

(52) U.S. Cl. .................. 343/702; 343/767; 343/846
(58) Field of Classification Search .......... 343/700 MS, 343/702, 767, 846
See application file for complete search history.

(56) References Cited

U.S. PATENT DOCUMENTS 6,822,611 B1 * 11/2004 Kontogeorgakis et al. ... 343/702

2006/0202895 A1 * 9/2006 Nam et al. ................. 343/702
2007/0176830 A1 * 8/2007 Winter ....................... 343/702

* cited by examiner

*Primary Examiner*—Shih-Chao Chen
(74) *Attorney, Agent, or Firm*—WPAT, P.C.; Anthony King

(57) ABSTRACT

A wireless apparatus has a main housing, a movable housing relatively extended to the main housing. The main housing contains a first PCB with a first layer being fully laid metal material. The movable housing contains a second PCB with a second layer being fully laid metal material. An insulation route is laid on the second layer and led to the border of the second layer. A connection component electronically connects the first layer and the second layer. When the wireless apparatus is operated at wireless communication, the cooperation of the first layer, the second layer, the insulation route and the connection component adjusts the electrical characteristic of the first and second PCBs for eliminating a parasitic effect being caused of movement of the first and second PCBs and increasing gain of the antenna of the wireless apparatus.

14 Claims, 3 Drawing Sheets

WIRELESS APPARATUS FOR INCREASING ANTENNA GAIN

BACKGROUND OF THE INVENTION

1. Field of the Invention

The invention relates to a wireless apparatus for increasing antenna gain, and particularly to a wireless apparatus capable of eliminating parasitic effect and increasing antenna gain.

2. The Related Art

According to the advancement of wireless communication technology and wireless communication service, a wireless communication apparatus is necessary for life, and particularly a mobile phone. The mobile phone with powerful function and small volume is getting popular nowadays. Therefore, the downsizing issue is one of designed targets for the mobile phone.

The mobile phone for the mentioned downsizing issue contains problems both at the closed position and the opened position as well. The mobile phone is operated at wireless communication in the opened position, else in the closed position. When the mobile phone is in the opened position, the movable housing of the mobile phone relatively moves to the main housing of the mobile phone, for example the movable housing rotates on the main housing, the movable housing slides on the main housing, etc.

According to the movement of the main housing and the movable housing, a main printed circuit board received in the main housing and a sub printed circuit board received in the movable housing relatively move to each other. The main printed circuit board electronically connects the sub printed circuit board through a connection component.

According to the movement of the main printed circuit board of the main housing and the sub printed circuit board of the movable housing, the mobile phone is caused a parasitic effect. The parasitic effect influences gain of the antenna of the mobile phone. While considering the parasitic effect, the antenna or layout of the main printed circuit board and the sub printed circuit board are re-designed. Therefore, time cost for re-designed of the antenna, the main printed circuit and the sub printed circuit board is raised.

SUMMARY OF THE INVENTION

An object of the present invention is to provide a wireless apparatus having a main housing and a movable housing relatively moved to the main housing. A first printed circuit board with a first layer being fully laid metal material is received in the main housing. A second printed circuit board with a second layer being fully laid metal material is received in the movable housing.

A connection component electronically connects to the first layer of the first printed circuit board and the second layer of the second printed circuit board. An insulation route is laid on the second layer of the second printed circuit board and led to the border of the second layer of the second printed circuit board.

When the wireless apparatus is operated at wireless communication, the main housing and the movable housing relatively extend to each other. Therefore, the first printed circuit board and the second printed circuit board relatively extend to each other and then cause a parasitic effect to influence gain of the antenna of the wireless apparatus. The cooperation of the first layer of the first printed circuit board, the second layer of the second printed circuit board, the connection component and the insulation route adjusts the electrical characteristic of the first printed circuit board and the second printed circuit board for eliminating the parasitic effect and increasing gain of the antenna of the wireless apparatus.

BRIEF DESCRIPTION OF THE DRAWINGS

The present invention will be apparent to those skilled in the art by reading the following description of a preferred embodiment thereof, with reference to the attached drawings, in which.

DETAILED DESCRIPTION OF THE PREFERRED EMBODIMENT

Figure 1:
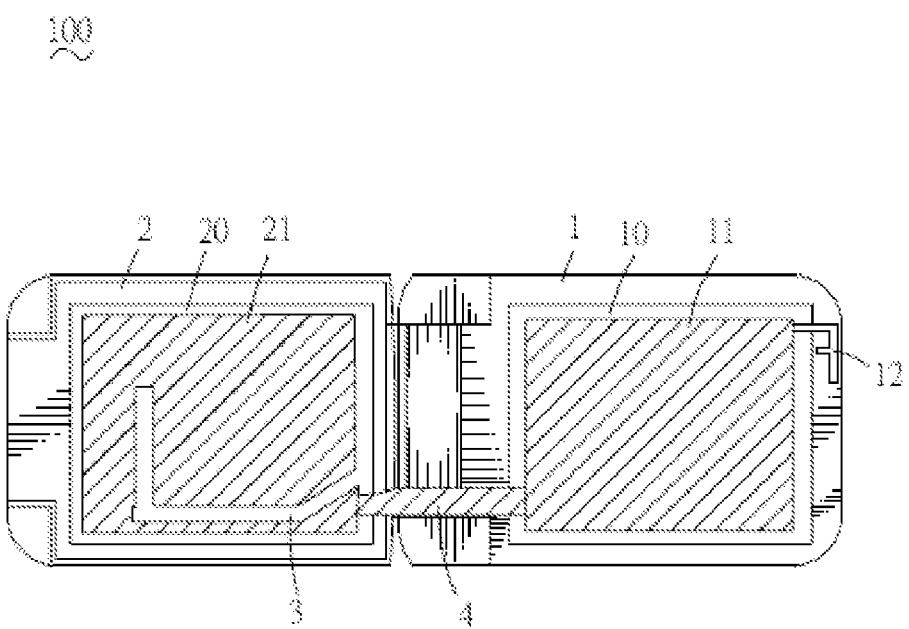
FIG. 1 shows a first preferred embodiment of a wireless apparatus according to the present invention.

Please refer to FIG. 1. A first preferred embodiment of a wireless apparatus 100 according to the present invention has a main housing 1 and a movable housing 2. In this case, the wireless apparatus 100 is a mobile phone. The main housing 1 of the wireless apparatus 100 and the movable housing 2 of the wireless apparatus 100 relatively move to each other for operating purpose. For example, the main housing 1 of the wireless apparatus 100 and the movable housing 2 of the wireless apparatus 100 relatively extend to each other for wireless communication purpose, else the movable housing 2 of the wireless apparatus 100 covers the main housing 1 of the wireless apparatus 100.

The main housing 1 of the wireless apparatus 100 contains a first printed circuit board 10. The first printed circuit board 10 has a first layer 11 being fully laid metal material. The movable housing 2 of the wireless apparatus 100 contains a second printed circuit board 20. The second printed circuit board 20 has a second layer 21 being fully laid metal material. An insulation route 3 is laid on the second layer 21 of the second printed circuit board 20 and led to the border of the second layer 21 of the second printed circuit board 20. In this case, the first printed circuit board 10 and the second printed circuit board 20 are multilayer printed circuit boards.

A connection component 4 electronically connects to the metal material of the first layer 11 of the first printed circuit board 10 and the metal material of the second layer 21 of the second printed circuit board 20. In this case, the connection component 4 is a flex printed circuit. The first layer 11 and the second layer 21 are respectively ground layer of the first printed circuit board 10 and the second printed circuit board 20.

When the wireless apparatus 100 is operated at wireless communication, the main housing 1 and the movable housing 2 of the wireless apparatus 100 relatively extend to each other. Therefore, the first printed circuit board 10 of the main housing 1 and the second printed circuit board 20 of the movable housing 2 relatively extend to each other. According to the cooperation of the first layer 11 of the first printed circuit board 10, the second layer 21 of the second printed circuit board 20, the insulation route 3 and the connection component 4 adjusts the electrical characteristic of the first printed circuit board 10 and the second printed circuit board 20, a parasitic effect being caused of the movement of the first printed circuit board 10 and the second printed circuit board 20 is eliminated. Therefore gain of the antenna 12 of the wireless apparatus 100 is increased.

Figure 2:
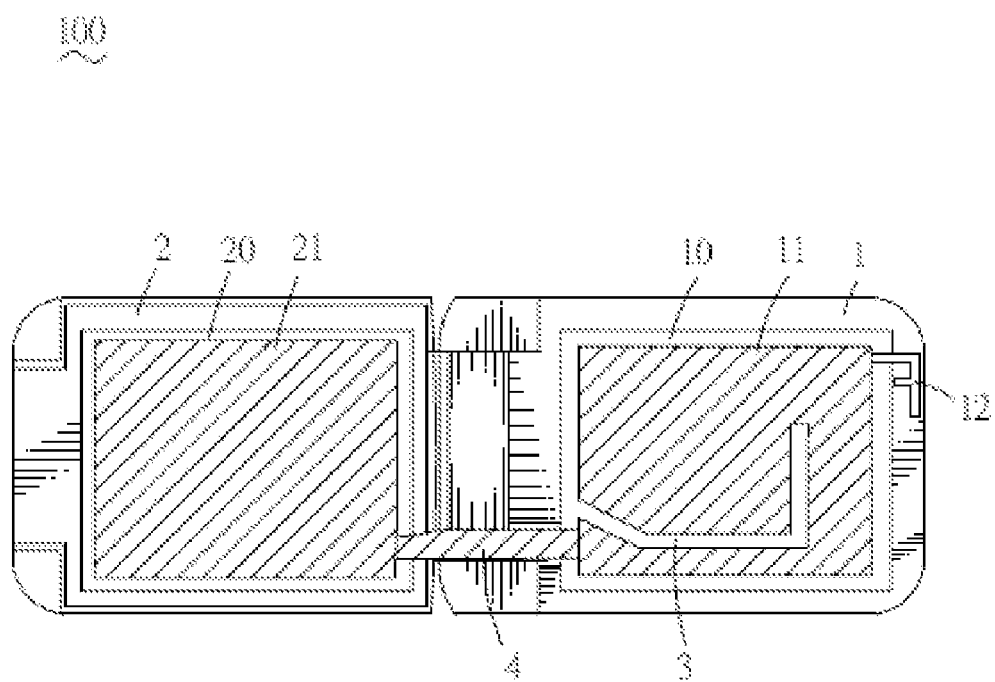
FIG. 2 illustrates a second preferred embodiment of the wireless apparatus according to the present invention.
Figure 3:
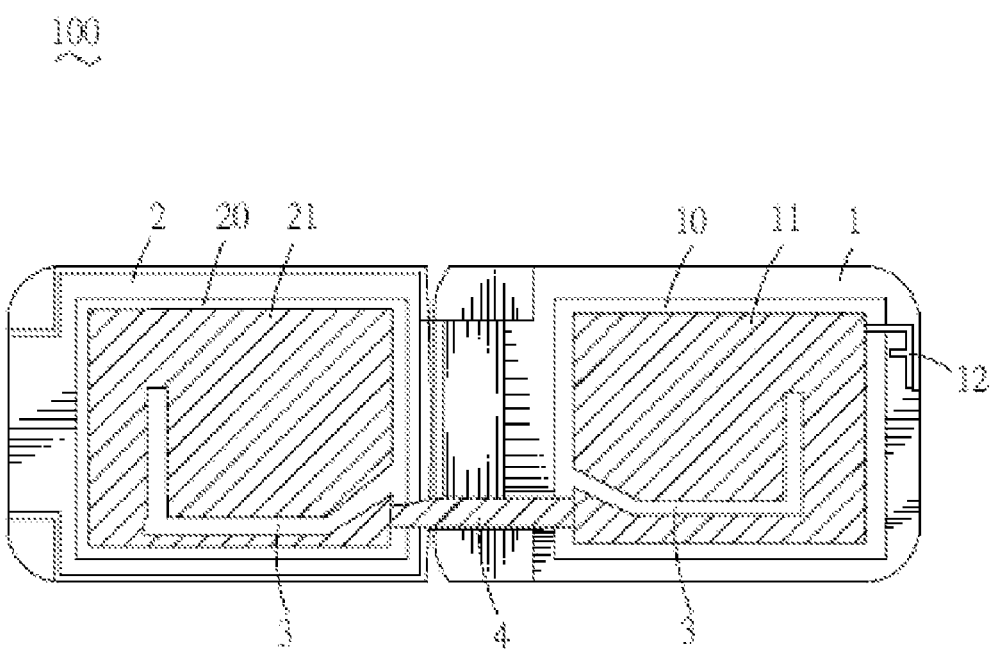
FIG. 3 shows a third preferred embodiment of the wireless apparatus according to the present invention.

Please refer to FIG. 2, which shows a second preferred embodiment of the wireless apparatus 100. The insulation route 3 is laid on the first layer 11 of the first printed circuit board 10 and led to the border of the first layer 11 of the first printed circuit board 10. Please refer to FIG. 3, which shows a third preferred embodiment of the wireless apparatus 100. The insulation route 3 is laid on both the first layer 11 of the first printed circuit board 10 and the second layer 21 of the second printed circuit board 20 and led to the border of the first layer 11 of the first printed circuit board 10 and the border of the second layer 21 of the second printed circuit board 20 respectively.

Furthermore, the present invention is not limited to the embodiments described above; various additions, alterations and the like may be made within the scope of the present invention by a person skilled in the art. For example, respective embodiments may be appropriately combined.

What is claimed is:

1. A wireless apparatus, comprising:
   a main housing;
   an antenna coupled to said main housing;
   a movable housing coupled to said main housing;
   a first printed circuit board being received in said main housing, having a first layer being fully laid metal material;
   a second printed circuit board being received in said movable housing, having a second layer being fully laid metal material;
   a connection component electronically connected to said metal material of said first layer of said first printed circuit board and said metal material of said second layer of said second printed circuit board; and
   an insulation route being laid on said first layer of said first printed circuit board and led to the border of said first layer of said first printed circuit board, wherein said connection component and said insulation route are configured to be capable of adjusting an electrical characteristic of said first printed circuit board and said second printed circuit board to eliminate parasitic effect and to increase gain of said antenna.

2. The wireless apparatus as claimed in claim 1, wherein said wireless apparatus is a mobile phone.

3. The wireless apparatus as claimed in claim 1, wherein said movable housing is extended over said main housing.

4. The wireless apparatus as claimed in claim 1, wherein said movable housing is pivotably connected to said main housing.

5. The wireless apparatus as claimed in claim 1, wherein said first layer is the ground layer of the first printed circuit board and said second layer is the ground layer of said second printed circuit board.

6. The wireless apparatus as claimed in claim 1, wherein said connection component is a flex printed circuit.

7. The wireless apparatus as claimed in claim 1, wherein said first printed circuit board and said second printed circuit board are multilayer printed circuit boards.

8. A wireless apparatus, comprising:
   a main housing;
   an antenna coupled to said main housing;
   a movable housing coupled to said main housing;
   a first printed circuit board being received in said main housing, having a first layer being fully laid metal material;
   a second printed circuit board being received in said movable housing, having a second layer being fully laid metal material;
   a connection component electronically connected to said metal material of said first layer of said first printed circuit board and said metal material of said second layer of said second printed circuit board; and
   an insulation route being laid on said second layer of said second printed circuit board and led to the border of said second layer of said second printed circuit board, wherein said connection component and said insulation route are configured to be capable of adjusting an electrical characteristic of said first printed circuit board and said second printed circuit board to eliminate parasitic effect and to increase gain of said antenna.

9. The wireless apparatus as claimed in claim 8, wherein said wireless apparatus is a mobile phone.

10. The wireless apparatus as claimed in claim 8, wherein said movable housing is extended over said main housing.

11. The wireless apparatus as claimed in claim 8, wherein said movable housing is pivotably connected to said main housing.

12. The wireless apparatus as claimed in claim 8, wherein said first layer is the ground layer of the first printed circuit board and said second layer is the ground layer of said second printed circuit board.

13. The wireless apparatus as claimed in claim 8, wherein said connection component is a flex printed circuit.

14. The wireless apparatus as claimed in claim 8, wherein said first printed circuit board and said second printed circuit board are multilayer printed circuit boards.

* * * * *